(12) United States Patent
Tsai et al.

(10) Patent No.: US 6,294,219 B1
(45) Date of Patent: *Sep. 25, 2001

(54) METHOD OF ANNEALING LARGE AREA GLASS SUBSTRATES

(75) Inventors: Chuang-Chuang Tsai, San Jose; Takako Takehara, Hayward; Regina Qiu, Cupertino; Yvonne LeGrice, Mountain View; William Reid Harshbarger, San Jose; Robert McCormick Robertson, Santa Clara, all of CA (US)

(73) Assignee: Applied Komatsu Technology, Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/033,868

(22) Filed: Mar. 3, 1998

(51) Int. Cl.⁷ ............................ B05D 3/02; C23C 14/10; C23C 16/24
(52) U.S. Cl. .................. 427/314; 427/554; 427/167; 427/376.2; 427/255.18; 427/255.27; 427/294
(58) Field of Search .................................. 427/554, 109, 427/167, 255, 376.2, 374.3, 314, 294, 379, 255.11, 255.18, 255.19, 255.27

(56) References Cited

U.S. PATENT DOCUMENTS

| | | |
|---|---|---|
| 4,339,340 * | 7/1982 | Muraoka et al. .................... 252/79.5 |
| 4,597,159 * | 7/1986 | Usami et al. ........................ 29/571 |
| 5,213,670 | 5/1993 | Bertagnolli et al. . |
| 5,259,881 | 11/1993 | Edwards et al. . |
| 5,372,836 * | 12/1994 | Imahashi et al. ........................ 427/8 |
| 5,470,619 * | 11/1995 | Ahn et al. ............................ 427/578 |
| 5,492,843 * | 2/1996 | Adachi et al. .......................... 437/21 |
| 5,512,320 | 4/1996 | Turner et al. . |
| 5,607,009 | 3/1997 | Turner et al. ......................... 165/48.1 |
| 5,710,050 * | 1/1998 | Makita et al. ............................ 437/7 |
| 5,766,344 * | 6/1998 | Zhang et al. ........................... 117/103 |

FOREIGN PATENT DOCUMENTS

| | | |
|---|---|---|
| 0 731 493 | 9/1996 | (EP) . |
| 0 810 640 | 12/1997 | (EP) . |
| 58-124224 | 7/1983 | (JP) . |
| 7221035 * | 8/1995 | (JP) . |

OTHER PUBLICATIONS

Mei, P. et al., "Laser dehydrogenation/crystallization of plasma-enhanced chemial vapor deposited amorphous silicon for hybrid thin film transistors", Appl. Phys. Lett., vol. 64, No. 9, pp. 1132-1134, 1994.

* cited by examiner

Primary Examiner—Shrive P. Beck
Assistant Examiner—Michael Barr
(74) Attorney, Agent, or Firm—Robert J. Stern

(57) ABSTRACT

A thin film layer can be formed on a glass substrate by preheating the substrate, depositing an amorphous silicon precursor layer on the substrate at a first temperature, and annealing the substrate in a thermal processing chamber at a second temperature sufficiently higher than the first temperature to substantially reduce the hydrogen concentration in the precursor layer. The preheating and annealing steps can occur in the same thermal processing chamber. Then the precursor layer is converted to a polycrystaline silicon layer by laser annealing.

7 Claims, 3 Drawing Sheets

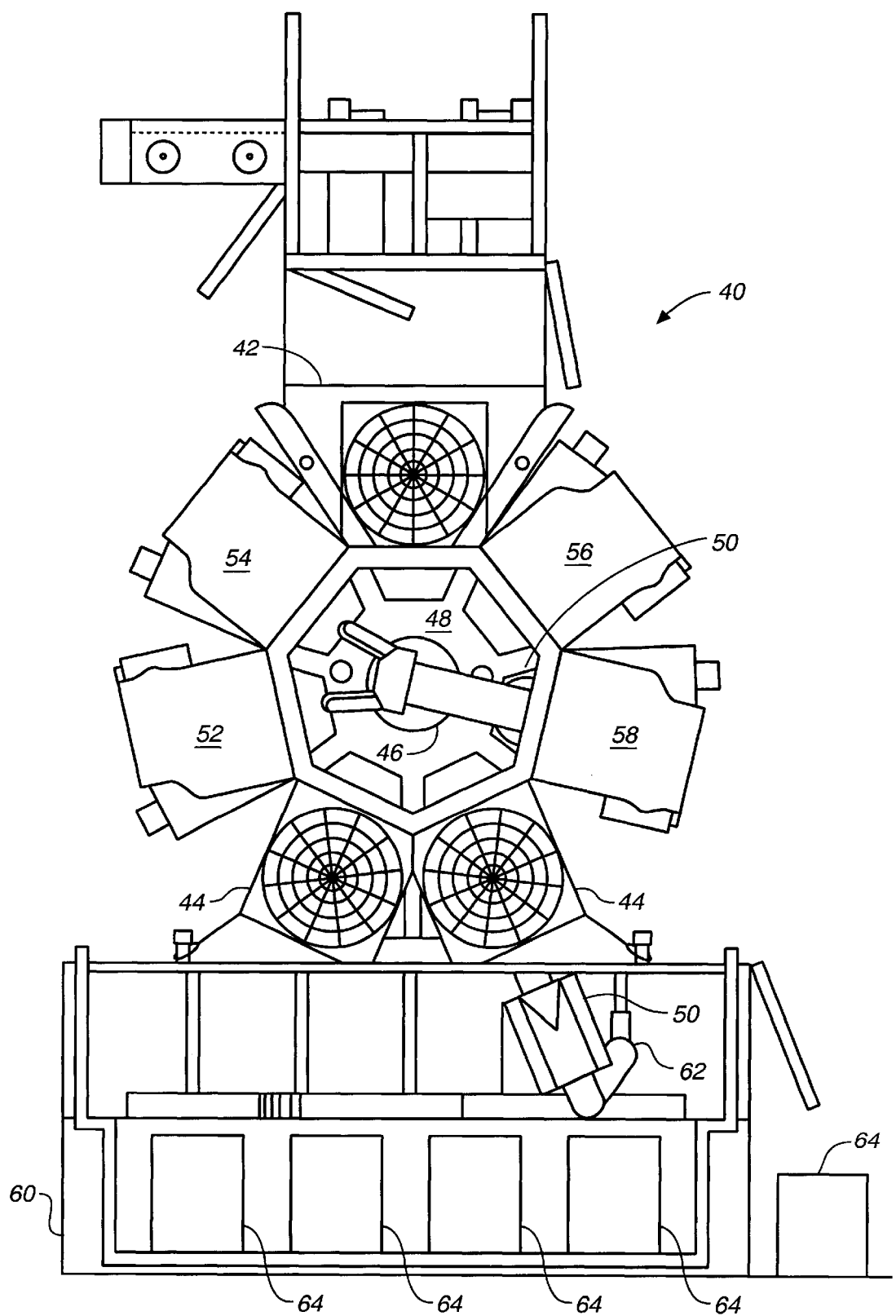
FIG._1

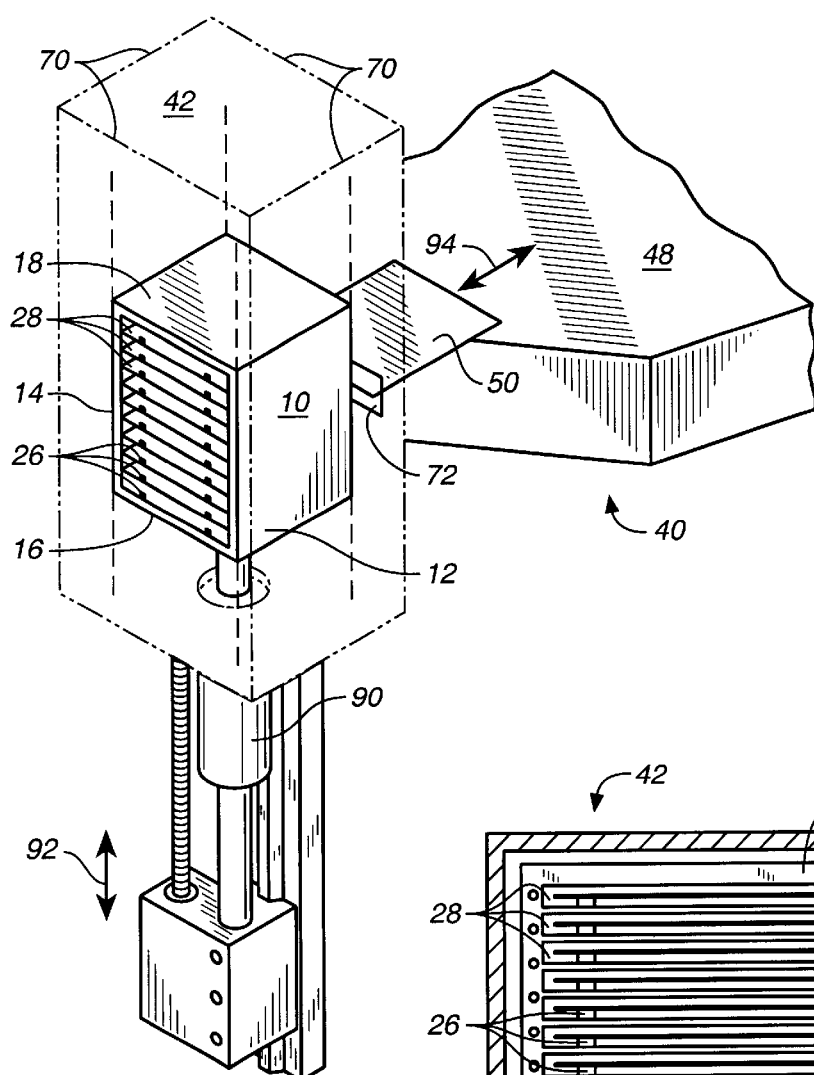
FIG._2A
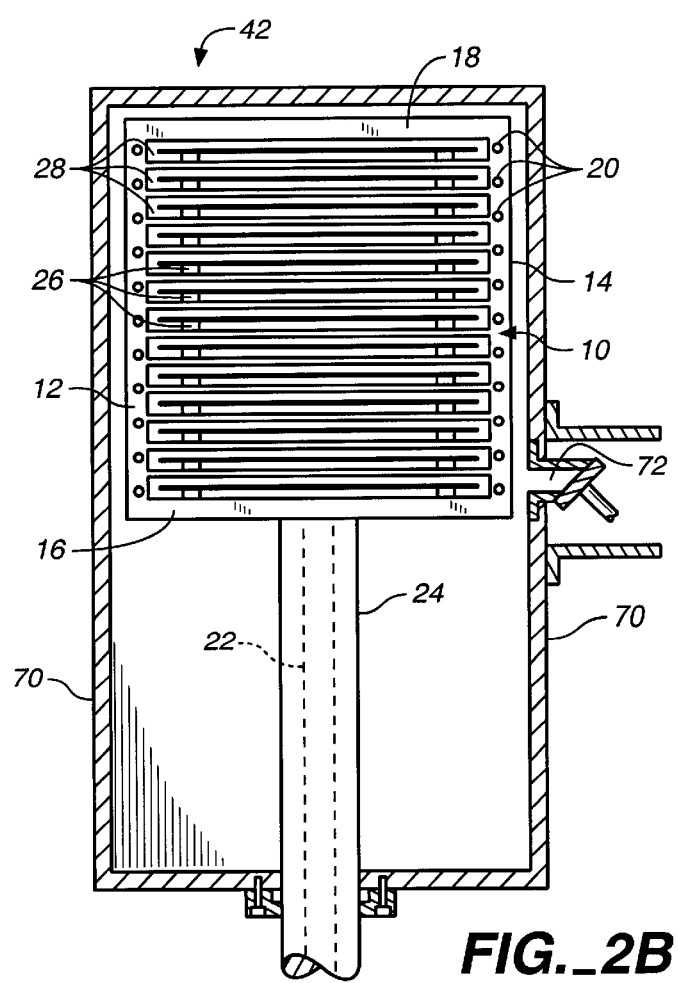
FIG._2B

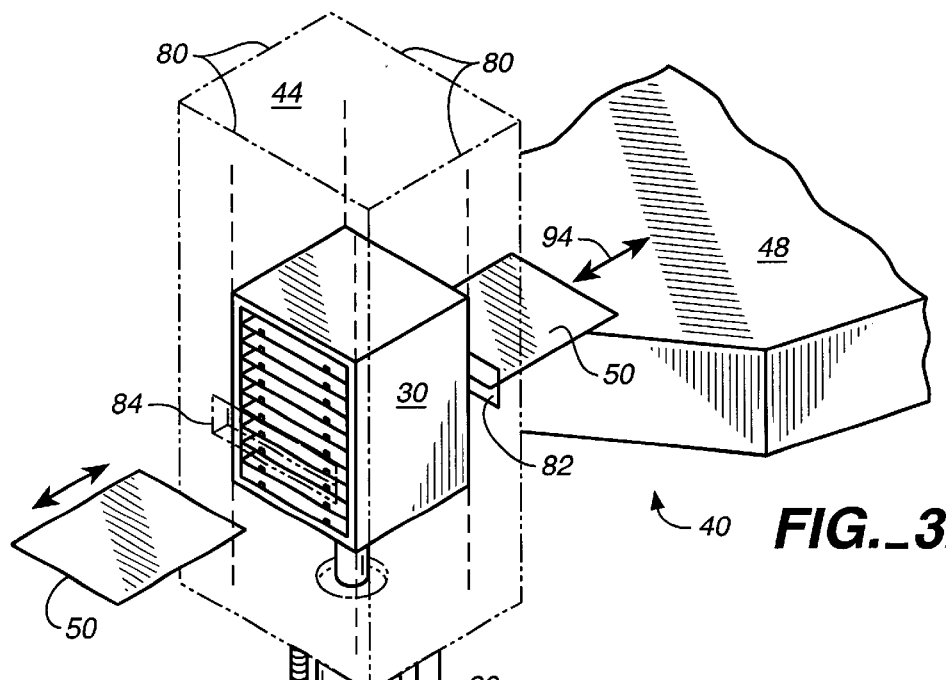
FIG._3A
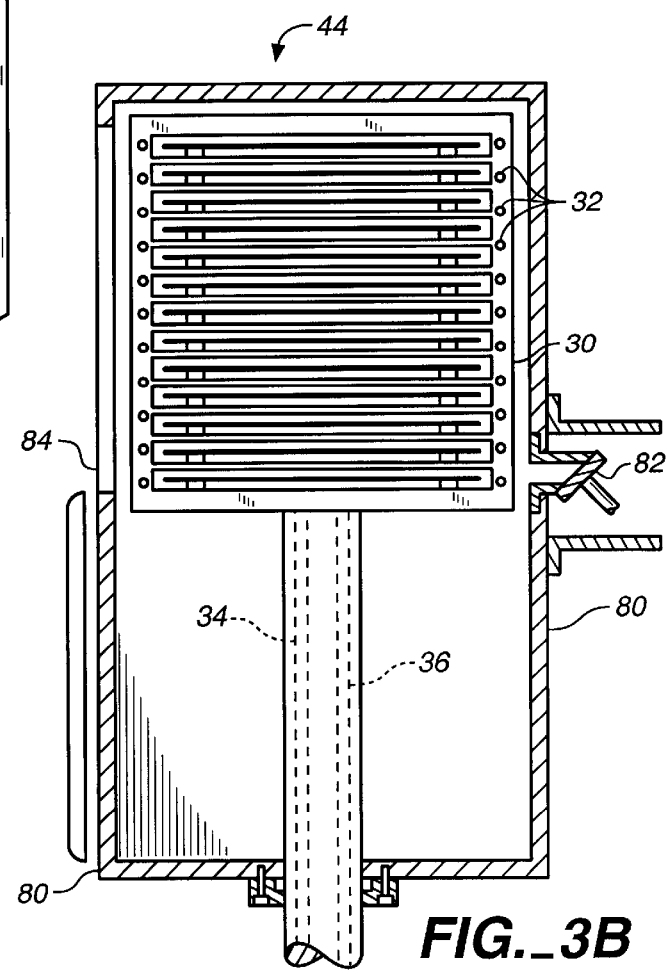
FIG._3B

METHOD OF ANNEALING LARGE AREA GLASS SUBSTRATES

BACKGROUND

The present invention relates generally to a method of processing glass substrates, and more particularly to a method of annealing amorphous silicon films deposited on glass substrates.

Thin film transistors are made on large glass substrates or plates for use in monitors, flat panel displays, solar cells, and the like. The transistors are made by sequential deposition of various thin films, including amorphous silicon (both doped and intrinsic), silicon oxide, and silicon nitride. These thin films can be deposited by chemical vapor deposition (CVD).

A CVD process may require that the substrates withstand temperatures on the order of 280–400° C. CVD processing has found widespread use in the manufacture of integrated circuits in silicon wafers. Silicon is a conductive material, and it can be heated and cooled quite rapidly without breaking or warping the wafer. However, glass is a dielectric material that is very brittle and is subject to warping or cracking when cooled or heated too rapidly. Thus, great care must be taken to adjust the rate of heating or cooling of large area glass substrates to avoid thermal stress and resulting damage.

Typically, to carry out the CVD process, the substrate is preheated in a heating chamber to about the deposition temperature. Once the substrate reaches the desired temperature, it is transferred into a processing chamber for deposition of the film. Then the substrate is transferred to a cooling chamber to cool it, e.g., to room temperature. To reduce the danger of contamination, the heating, deposition and cooling chambers may be included in a single tool so that the substrate may be transported between chambers without being removed from a vacuum environment. Such a tool, e.g., the system described in U.S. Pat. No. 4,951,601, which is incorporated herein by reference, may include a central robotic chamber connected to various processing chambers. The processing chambers may hold only a single substrate to improve process uniformity and controllability. However, due to the lengthy period of time required to heat up and cool down the temperature of a glass substrate (e.g., about five minutes each to heat a large area glass substrate to about 400° C. and to cool it back to room temperature) to avoid damage or warpage to the substrate, the heating and cooling chambers may hold several glass substrates at the same time to improve the throughput of the system.

One step in the fabrication of a thin film transistor is the formation of a polycrystaline silicon layer. One process of forming a polycrystaline silicon layer begins with the deposition of an amorphous silicon precursor layer on the substrate by CVD. Following the deposition step, the substrate is removed from the CVD tool and transported to a furnace for annealing, e.g., at temperatures of about 350–400° C. The annealing temperature is lower than the deposition temperature. Thereafter, the amorphous silicon may be converted to polycrystaline silicon by laser annealing.

One problem encountered in the fabrication of polycrystaline silicon is blistering of the substrate surface during the laser annealing step. This blistering renders the substrate unusable and reduces process yield. One cause of blistering is the outgassing of hydrogen which was incorporated in the amorphous silicon precursor layer during the deposition step. To reduce the amount of hydrogen incorporated in the precursor layer, the amorphous silicon deposition could be performed at a "high" temperature, e.g., at 450–470° C. Unfortunately, such high temperatures are destructive to the process chamber.

SUMMARY

In one aspect, the invention is directed to a method of forming a polycrystaline silicon layer on a glass substrate. In the method, a glass substrate is preheated and an amorphous silicon precursor layer is deposited on the substrate at a first temperature. The substrate is annealed in a thermal processing chamber at a second temperature sufficiently higher than the first temperature to substantially reduce the hydrogen concentration in the precursor layer, and the precursor layer is converted to a polycrystaline silicon layer by laser annealing.

Implementations of the invention may include the following. The first temperature may be about 380 to 400° C., and the second temperature may be about 400 to 470° C. The annealing step can occur in an atmosphere containing nitrogen and possibly hydrogen. The preheating and annealing steps may occur in the same thermal processing chamber. The substrate may be cooled to a handling temperature before converting the precursor layer to polycrystaline silicon.

In another aspect, the invention is directed to a method of forming a thin film on a glass substrate. In the method, a glass substrate is preheated in a thermal processing chamber to a first temperature. A thin film is deposited by chemical vapor deposition on the substrate at a second temperature lower than the first temperature. The substrate is annealed at the first temperature in the thermal processing chamber.

Implementations of the invention may include the following. The thin film may be an amorphous silicon layer or a tetraethylorthosilicate layer.

Advantages of the invention may include the following. The hydrogen content of the amorphous silicon precursor layer is reduced, thus reducing blistering and increasing yield. The amorphous silicon precursor layer may be deposited at relatively low temperatures, thus increasing the lifetime of the processing chamber. Annealing of the precursor layer may be performed in the CVD tool, increasing throughput and decreasing the danger of contamination.

BRIEF DESCRIPTION OF THE DRAWING

FIG. 1 is a plan view of a glass substrate processing system.

FIG. 2A is a perspective view of a heating chamber from the system of FIG. 1.

FIG. 2B is a cross-sectional view of a heating cassette from the heating chamber of FIG. 2A.

FIG. 3A is a perspective view of a load lock/cooling chamber from the system of FIG. 1.

FIG. 3B is a cross sectional view of a cooling cassette from the load lock/cooling chamber of FIG. 3A.

DETAILED DESCRIPTION

Referring to FIG. 1, a processing system 40 includes a heating or thermal processing chamber 42, two cooling/load lock chambers 44, four processing chamber 52, 54, 56, and 58, and a vacuum-compatible robot 46 located in a central vacuum chamber 48 to transfer glass substrates 50 between the heating, cooling and processing chambers. A description of a similar processing system and similar heating and cooling chambers may be found in U.S. Pat. Nos. 5,607,009 and 5,512,320, the disclosures of which are incorporated herein by reference. The processing system 40 may also include a factory automation unit 60 with an atmospheric robot 62 for transferring substrates between cooling/load lock chambers 44 and substrate transport cassettes 64.

Referring to FIGS. 2A and 2B, the heating chamber 42 includes a heating cassette 10 surrounded by chamber walls 70 that are spaced apart from the heating cassette. One of the chamber walls, adjacent to the central vacuum chamber 48, is fitted with a slit valve 72 through which the glass plates can be transferred into and out of the cassette 10. The ambient atmosphere in the heating chamber 42 may contain nitrogen, nitrogen and hydrogen, e.g., about 95% nitrogen and 5% hydrogen, or an inert gas.

The heating cassette 10 is a generally rectangular frame with sidewalls 12 and 14, and a bottom wall 16. A lid 18 is fastened to the top of the heating cassette 10. The sidewalls 12 and 14 are fitted with electric resistor heating coils 20. A channel 22 (shown in phantom in FIG. 2B) through a support shaft 24 may contain wires to connect heating coils 20 to a source of power (not shown).

A plurality of heat conductive shelves 28 fit between the sidewalls 12 and 14. The shelves 28 thermally contact the sidewalls 12 and 14 to ensure rapid and uniform control of the temperature of the shelves 28. The shelves 28 are made of a thermally conductive material, e.g., a metal such as aluminum, copper, or stainless steel clad copper. The number of shelves in cassette 10 depends upon the desired size of the cassette and the relative amount of time required to heat, transfer and process the glass substrates.

Situated on the shelves 28, or fastened thereto, are a plurality of supports 26 that are made of a thermally non-conductive material, such as high temperature glass or quartz. The supports 26 serve to support the glass substrates 50 to be processed so that there is a gap between the shelves 28 and the substrates 50. This gap ensures that the glass substrates are heated and cooled indirectly by radiation and gas conduction rather than by direct contact of the substrates 50 and the shelves 28. This reduces the danger that the glass substrates will be stressed and crack. Further, the interleaving of the glass substrates 50 and the shelves 28 provides heating and cooling of the glass substrates 50 from both sides, providing more rapid and more uniform heating and cooling of the substrates.

Referring to FIGS. 3A and 3B, each cooling/load lock chamber 44 includes a cooling cassette 30 surrounded by chamber walls 80. One of the sidewalls 80 adjacent the central vacuum chamber 48 has a slit valve 82 formed therein, and one of the sidewalls adjacent the factory automation unit 60 has a port 84 formed therein.

The cooling cassette is constructed similarly to heating cassette 10, but the sidewalls have channels 32 in which a cooling gas, such as helium, or liquid, such as water, can be circulated. Inlet and outlet pipes 34 and 36 (shown in phantom), respectively, may be provided for circulation of the coolant by means of a suitable pump (not shown).

Referring to FIGS. 2A and 3A, the heating and cooling cassettes of the invention are mounted on an elevator 90. The elevator can move the cassettes 10 and 30 up and down so that a different shelf 28 is presented to the vacuum robot 46 after each transfer of a glass substrate 50. These elevator mechanisms are conventional and do not need to be described in detail. The elevator mechanism itself can be outside of the system 40 and connected via a seal through a lower wall of the system. Thus the cassettes 10, 30 move in the direction of the arrow 92 and the glass substrates 50 move in the direction of the arrow 94 during transfer.

Referring to FIGS. 2B and 3B, the temperature of the conductive shelves can be regulated by the heating coils 20 or cooling channels 32 within the sidewalls. The rate of heating or cooling of the glass substrates is determined by the emissivity of the shelf material, the emissivity of the glass itself and the vacuum pressure of the chamber. The rate of temperature change can be slow enough so that cracking of the glass is avoided. The heat transport described by the Stephan-Boltzmann equation is given in equation (1) below:

$$E_r = \frac{\sigma \varepsilon_1 \varepsilon_2}{\varepsilon_1 + \varepsilon_2 - \varepsilon_1 \varepsilon_2}(T_1^4 - T_2^4) \tag{1}$$

where $E_r$ is the amount of energy transported in Watts/cm$_2$, $T_1$ is the temperature of the shelves in °K, $T_2$ is the temperature of the glass in °K, $\varepsilon_1$ is the emissivity of the shelves, $\varepsilon_2$ is the emissivity of the glass, and $\sigma$ is the Stefan-Boltzmann constant. Heat transfer by gas conduction is proportional to the gas pressure and is given by equation (2) below:

$$E_c = \frac{\Delta(T_1 - T_2)\beta}{d + 2\beta c} - P \tag{2}$$

where $E_c$ is the heating energy in Watts/cm$_2$, $\Delta$ is the mean conductivity in °K, d is the gap between planes in cm, $\beta$ is the gas accommodation coefficient, c is the gas mean free path in microns, P is the pressure in millitorr, and $T_1$ and $T_2$ have the meanings given above for equation (1).

Returning to FIG. 1, a process for fabricating a polycrystaline silicon layer will be described. A substrate 50 is brought to the factory automation unit 60 in a transfer cassette 64 and loaded into one of the cooling/load lock chambers 44 by the atmospheric robot 62 through the port 84 (see FIG. 3A). When all of the shelves are filled, the port is closed and the chamber 44 is brought to vacuum by means of a conventional evacuation pump (not shown). When the desired pressure is reached, the slit valve 72 (see FIG. 2A) in the sidewall adjacent to the central vacuum chamber 48 opens to allow the vacuum robot 46 to transfer the substrate 50 to the heating chamber 42. Two cooling/load lock chambers 44 are provided so that when one batch of substrates is being processed, a second batch of substrates can be loaded.

The glass substrate is transported from the cooling/load lock chamber 44 to the heating chamber 42. The glass substrate may be heated to a temperature above the deposition temperature. Once the glass substrate has been heated, the vacuum robot 46 transfers it to one of the processing chambers 52, 54, 56 or 58 for deposition of an amorphous silicon precursor layer thereon. The CVD process may occur at a relatively "low" temperature, e.g., about 380–400° C.

After the amorphous silicon deposition process is complete, the robot transfers the glass substrate 50 back to the heating chamber 42 for annealing. Specifically, the substrate 50 may be heated in the chamber 42 to a temperature above the processing temperature. For example, the substrate temperature may reach about 400–470° C., e.g., about 420° C. The annealing step may occur in an atmosphere containing nitrogen, an inert gas, or possibly a mixture of nitrogen and hydrogen, e.g., about 95% nitrogen and 5% hydrogen. The annealing step may take about five to thirty minutes, e.g., about ten minutes.

Due to the large number of substrates and the amount of time required for annealing, it may be desirable to provide two or more heating chambers to improve the throughput of the system. One heating chamber may be used to preheat the substrates and the other heating chamber may be used for annealing. Alternately, the heating chamber may be equipped with more shelves than the cooling/load lock chambers. In addition, one of the load lock chambers may be converted into a heating/load lock chamber.

When the annealing step is completed, the substrate 50 is transferred to one of the cooling/load lock chambers 44 to be cooled to a handling temperature. The handling temperature is lower than the annealing temperature, but can be above room temperature, e.g., about 80–150° C. The cooling/load lock chamber 44 is vented, and the substrate is returned by the atmospheric robot 62 to the factory automation unit 60. Finally, the substrate is transported to another tool to be laser annealed to convert the amorphous silicon layer to a polycrystaline silicon layer.

The high temperature annealing step reduces the hydrogen content of the amorphous silicon precursor layer, thus reducing blistering during the laser annealing step and increasing yield. Specifically, the hydrogen content of the precursor layer deposited by a CVD process at about 380–400° C. is about 10–15% (atomic percentage), but by annealing the substrate at about 450–470° C., the hydrogen content of the precursor layer is reduced to approximately 2–4%, e.g., about 3%. Annealing temperatures above the deposition temperature but lower than about 450–470° C. will provide correspondingly less reduction in the hydrogen content. The annealing temperature may be selected to reduce the hydrogen content to less than about 7%, e.g., less than about 5%.

In summary, a batch of large area glass substrates may be transferred into a cassette in a cooling/load lock chamber, transferred to a heating chamber where they are brought to or above a processing temperature, transferred singly to one or more single substrate processing chambers for a "low temperature" amorphous silicon deposition step, transferred back to the heating chamber for a "high temperature" annealing step, and finally transferred back to the cooling cassette in the load lock chamber to be cooled to the handling temperature. The substrates can then be transferred out of the vacuum system for the laser annealing step. Since the annealing and deposition steps occur in the same tool without exposure to atmosphere, the danger of contamination of the substrate is reduced. In addition, since the same chamber can be used for preheating and annealing the substrates, a separate furnace is not required. Furthermore, since some substrates can be preheated while other substrates are being annealed, the throughput of the tool is improved.

The use of the same chamber for both preheating and annealing the substrate may also be advantageous in the fabrication of a silicon oxide gate layer. Specifically, a glass substrate may be preheated in the heating chamber, a tetraethylorthosilicate (TEOS) precursor layer may be deposited by CVD, and the substrate may be returned to the heating chamber to be annealed.

Although the invention has been described in terms of specific embodiments, various changes that can be made. For example, various other materials can be substituted for the cassettes, shelves, glass substrate supports and the like as described herein. The cassette shelves can be heated or cooled directly by means of suitable channels in the shelves themselves rather than indirectly as described. The cassettes of the invention can be connected to one or more batch-type CVD or other processing chambers. More than one batch-type heating and/or cooling chamber can be connected to one or more processing chambers. The heating and/or cooling chambers of the invention can be connected together or to other processing chambers, such as preclean, etch or physical vapor deposition chambers. Thus the invention is meant to be limited only by the scope of the appended claims.

What is claimed is:

1. A method of forming a film on each one of a plurality of substrates, comprising, for each one of said substrates, the sequential steps of:

preheating said one substrate in a heating chamber to an elevated temperature;

transferring said one substrate from the heating chamber to a vacuum chamber distinct from the heating chamber;

depositing a film on said one substrate in the vacuum chamber;

transferring said one substrate from the vacuum chamber to said heating chamber; and annealing said one substrate at an elevated temperature in said heating chamber;

wherein, within said heating chamber, the preheating step is performed for a first plurality of substrates and concurrently the annealing step is performed for a second plurality of substrates distinct from the first plurality.

2. The method of claim 1, wherein the temperature of the depositing step is about 380 to 400° C.

3. The method of claim 1, wherein the temperature of the preheating step is about 400 to 470° C.

4. The method of claim 1 wherein the film is an amorphous silicon layer.

5. The method of claim 1 wherein the film is a silicon oxide layer.

6. The method of claim 1, wherein no material is deposited on the substrate during the preheating step.

7. The method of claim 1, wherein the heating chamber is not a deposition chamber.

* * * * *